United States Patent [19]
Codina et al.

[11] Patent Number: 5,532,529
[45] Date of Patent: Jul. 2, 1996

[54] CONTACTLESS INDUCTANCE JOYSTICK SWITCH

[75] Inventors: George Codina, North Hollywood, Calif.; Donald L. Copple, Dunlap; Kevin G. Yakes, Peoria, both of Ill.

[73] Assignee: Caterpillar Inc., Peoria, Ill.

[21] Appl. No.: 338,925

[22] Filed: Nov. 14, 1994

[51] Int. Cl.⁶ .................................................. H01H 35/38
[52] U.S. Cl. ........................ 307/129; 200/1 A; 200/6 A; 273/148 B; 345/101
[58] Field of Search ........................... 307/129; 200/1 A, 200/6 A; 324/208; 273/148 B; 364/709.9; 345/101

[56] References Cited

U.S. PATENT DOCUMENTS

| | | | |
|---|---|---|---|
| 2,481,776 | 9/1949 | Osborn | 201/48 |
| 4,091,234 | 5/1978 | Bristow | 178/18 |
| 4,489,303 | 12/1984 | Martin | 338/128 |
| 4,639,667 | 1/1987 | Andresen | 324/208 |
| 4,642,595 | 2/1987 | Ruumpol | 336/135 |
| 4,685,678 | 8/1987 | Frederiksen | 273/148 |
| 4,825,157 | 4/1989 | Mikan | 324/208 |
| 4,855,704 | 8/1989 | Betz | 336/132 |
| 5,011,149 | 3/1991 | Purnell | 273/148 |
| 5,160,918 | 11/1992 | Saposnik et al. | 340/709 |
| 5,398,028 | 3/1995 | Foon | 341/20 |

*Primary Examiner*—William M. Shoop, Jr.
*Assistant Examiner*—Albert W. Paladini
*Attorney, Agent, or Firm*—R. Carl Wilbur; Mario J. Donato, Jr.

[57] ABSTRACT

In one aspect of the present invention, a contactless inductance switch is disclosed for use with a joystick. The switch is mechanically connected to a mass which is movable between a first and second position. When an operator presses the switch, the mass moves to the second position adjacent to an electrical circuitry. Sensing circuitry measures the change in inductance in the coil and produces a control signal indicating that the switch was pressed.

8 Claims, 2 Drawing Sheets

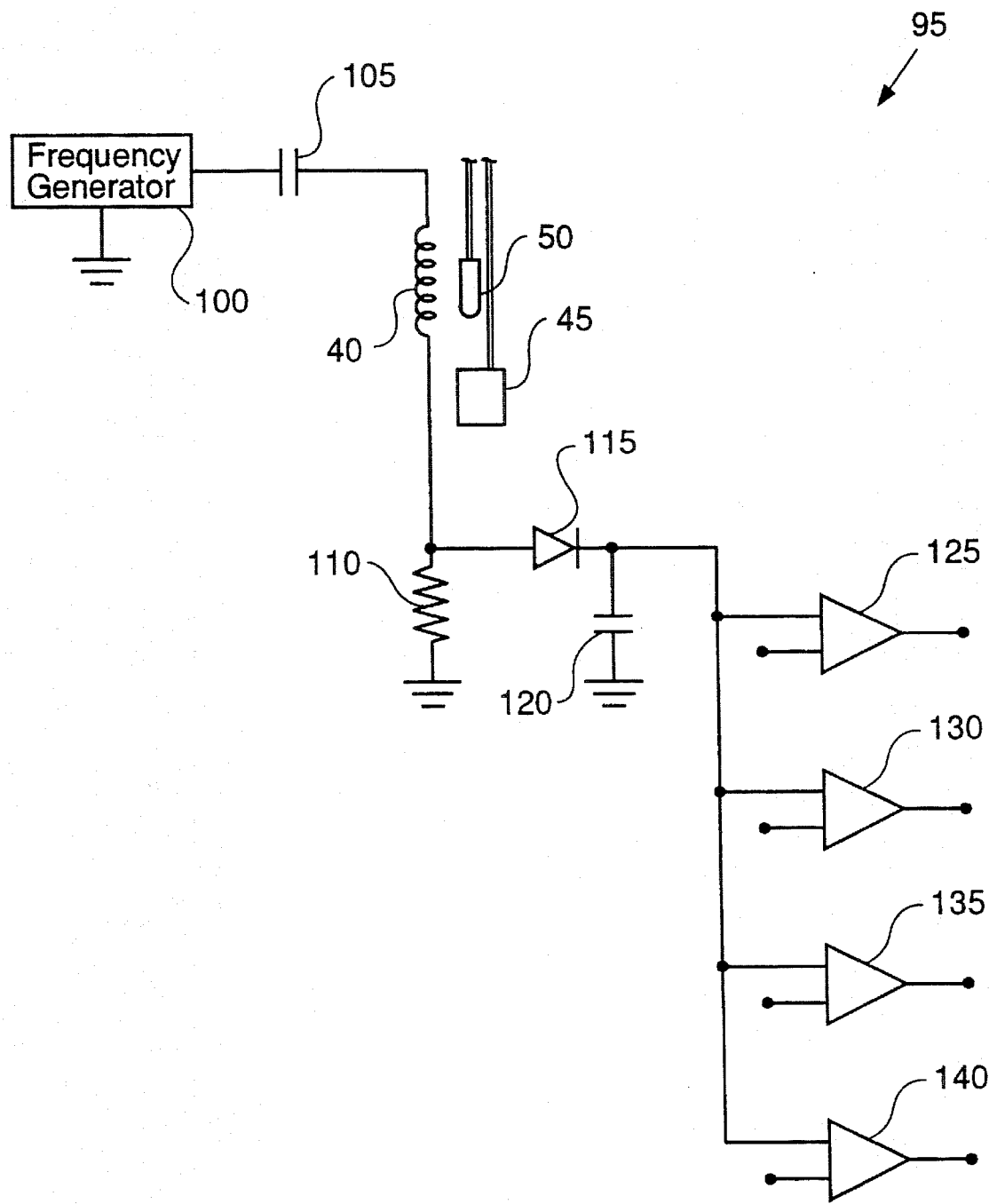

CONTACTLESS INDUCTANCE JOYSTICK SWITCH

FIELD OF THE INVENTION

The present invention relates to the field of joysticks and, more particularly, to electrical control switches on joysticks.

BACKGROUND OF THE INVENTION

Joysticks are routinely used in variety of control applications and provide a convenient way for an operator to provide control inputs. For example, a joystick could be used to control a fighter airplane, with the forward and aft motion controlling the elevator and the left and right motion controlling the ailerons. Joysticks suitable for such applications are well known in the art.

In some instances, it is desirable to provide control switches on the joystick handle to permit an operator to perform other functions. For example, in a fighter airplane, a missile launching switch could be located on the joystick control handle. The fighter pilot could then conveniently launch a missile without having to remove his hand from the flight controls.

There are known joysticks that include control switches on the joystick handle. Those switches are generally active switches that permit current to flow through the switch when the switch is in a closed position and cut current flow when the switch is open. An example of such a switch is a single-pole, single-throw momentary switch. Although such active switches perform acceptably, they have several drawbacks. For example, wires must be physically attached to the active switch. Because the joystick pivots in response to operator control movements the wires are exposed to significant repetitive motion. That motion can cause the wires to become brittle or otherwise weaken the wire and shorten the life span of the switch. Another drawback of active switches is that they require relatively large amounts of current to control the on/off signal. It would be preferable to have a switch that required less power.

Various types of passive sensing is known in the art. For example, U.S. Pat. No. 4,825,157 (the '157 patent) discloses a hall-effect joystick control. The patent does not disclose a switch mounted on the joystick. The joystick disclosed in the '157 patent includes an actuator member having a magnetic core. Hall-effect devices sense the motion of the magnetic core and produce control signals corresponding to the movement. One significant drawback to hall effect sensors is that they must incorporate a permanent magnet which degrades over time. The hall-effect sensor is also sensitive to external magnetic fields and may produce erroneous signals when exposed to an external magnetic field. Also, hall effect sensors are susceptible to shock and vibration damage, which makes them unsuitable in environments where shock and vibration are prevalent.

SUMMARY OF THE INVENTION

The present invention is directed toward overcoming one or more of the drawbacks associated with prior art joystick control switches. Other aspects and advantages of the present invention will become apparent from reading the detailed description of the preferred embodiment in connection with the drawings and appended claims.

Accordingly, it is an object of the present invention to provide a joystick control switch that can endure shock and vibration.

Still another object of the present invention is to provide a joystick control that will function properly despite the presence of fluctuating external magnetic fields.

These objects and advantages are achieved in an embodiment of the invention including a hollow shaft having a handle and being pivotally mounted on a base. A control switch is mounted on the handle and is mechanically linked to a mass installed within the shaft. Electrical windings are installed in the base and are connected to sensing circuitry. The control switch and mass are normally biased to a first position. When the operator presses the control switch, the mass moves to a second position adjacent the electrical conductors which changes the inductance of the conductors. In response to the change in inductions, the sensing circuit produces an output signal indicating that the operator has pressed the control switch.

BRIEF DESCRIPTION OF THE DRAWINGS

FIG. 2 shows a schematic diagram of an embodiment of the control circuitry used with an embodiment of the present invention.

DETAILED DESCRIPTION OF THE PREFERRED EMBODIMENT

Figure 1:
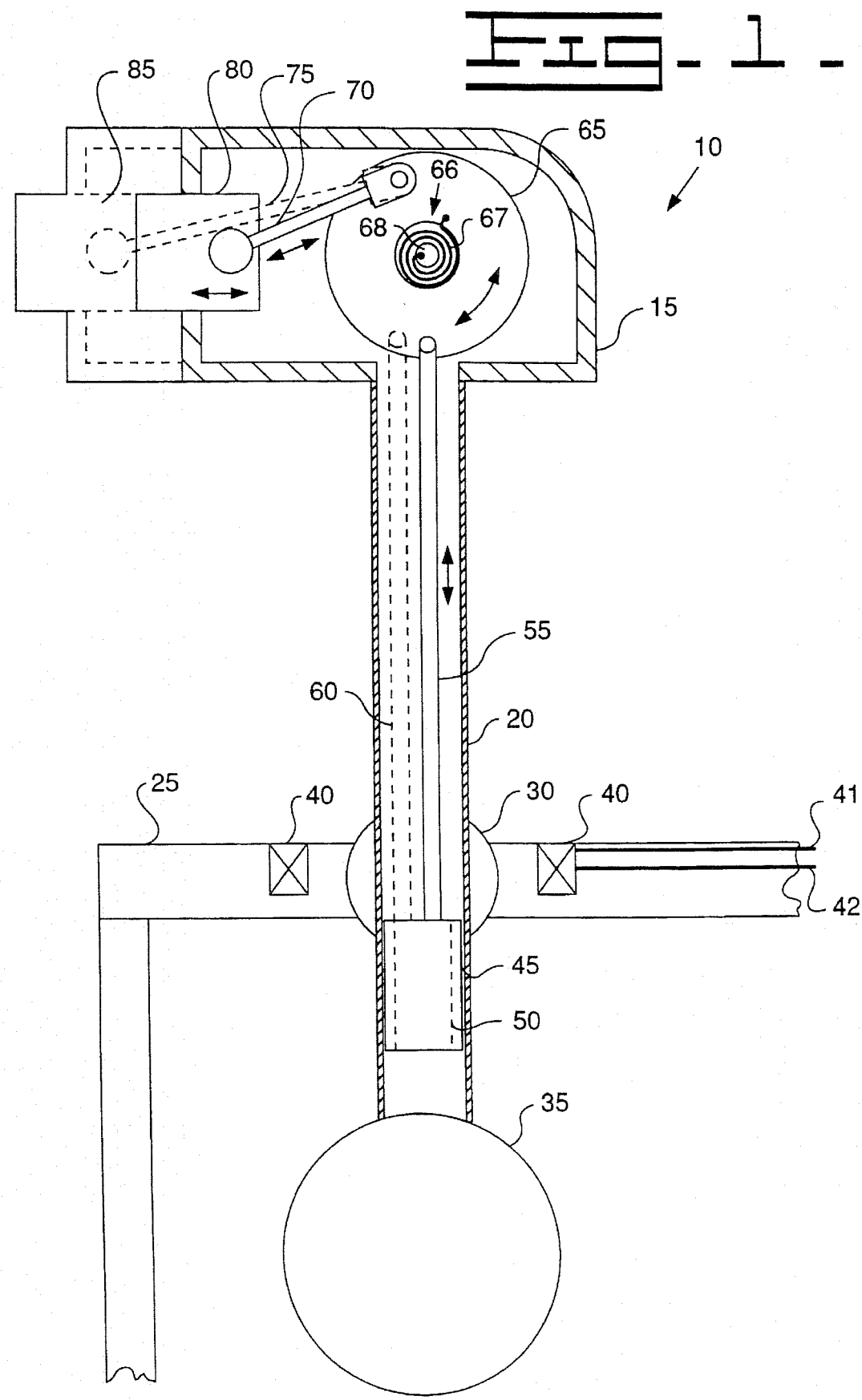
FIG. 1 shows a cross sectional view of a joystick with an embodiment of the control switch of the present invention.

The following is a detailed description of the best mode of the preferred embodiment of the invention. The present invention is not limited, however, to the single embodiment described herein. To the contrary the present invention includes all other embodiments and equivalents as may fall within the scope of the invention as defined by the appended claims.

FIG. 1 shows a cross sectional view of an embodiment of the joystick control switch 10 of the present invention. The joystick control switch 10 includes a joystick handle 15 attached to a shaft 20 that is pivotally mounted to the joystick base 25 through a swivel joint 30. Attached to the end of the shaft 20 opposite the joystick handle 15 is a mass 35 or other control device for producing control signals as a function of the position of the joystick handle 15. Since the joystick control signals do not form part of this invention, the mass 35 and other control features of the joystick will not be described further.

Installed in the joystick base is a winding of electrical conductors 40. Although in FIG. 1 the windings are shown encompassing the pivotal swivel joint 30, other configurations for the windings are possible without deviating from the spirit and scope of the present invention as defined by the appended claims. The winding 40 is connected to a sensing circuit (shown below in FIG. 2) through electrical conductors 41,42.

The shaft 20 is preferably hollow to accommodate movement of a first and second mass 45, 50 within the shaft 20. Preferably, the first mass 45 includes a void and the second mass 50 is formed to fit, and be moveable within, the void. A first mass linkage 55 is connected to the first mass 45 and is pivotally connected to a first bell crank 65. A second mass linkage 60 is connected to the second mass 50 and is pivotally connected to a second bell crank (not shown). The second bell crank is similar in design to the first bell crank and is located directly behind the first bell crank 65 in FIG. 1. A first control switch linkage 70 is pivotally connected to the first bell crank 65 and is pivotally connected to a first control switch 80. A second control switch linkage 75 is pivotally connected to the second bell crank and is pivotally connected to a second control switch 85.

The first control switch 80 and the first mass 45 are movable between first and second positions. Likewise, the second control switch 85 and the second mass 50 are moveable between first and second positions. Included in an embodiment of the present invention is biasing means 66 to bias the first and second control switches 80,85 and the first and second masses 45,50 to their respective first positions.

In a preferred embodiment, the biasing means 66 includes a spring 67 attached to the bell crank 65 and to a shaft 68 on which the bell crank 65 is pivotally mounted. To actuate a control switch, an operator will press the control switch. For example, if the operator presses the first control switch 80 thereby placing it in the second position, the mechanical linkage to the first mass 45 will cause the first mass 45 to move to the second position adjacent to electrical conductor windings 40. As will be understood by those skilled in the art, the inductance of the windings 40 will change when the first mass 45 moves from the first position to the second position. The sensing circuit (described below) senses the change in inductance and produces a control signal corresponding to the pressing of the first control switch 80.

Likewise, if the operator presses the second control switch 85 thereby placing it in the second position, the mechanical linkage to the second mass 50 will cause the second mass 50 to move to the second position adjacent to electrical conductor windings 40. As will be understood by those skilled in the art, the inductance of the windings 40 will change when the first mass 45 moves from the first position to the second position. The sensing circuit (described below) senses the change in inductance and produces a control signal corresponding to the pressing of the first control switch 80.

In a preferred embodiment, the mass of the first mass 45 is greater than the mass of the second mass 50. The larger first mass 45 will cause a greater change in inductance when it is moved to the second position than when the second mass 50 is moved to the second position. The sensing circuit is able to distinguish between the change in inductance caused by each mass and produces a corresponding control signal.

If the operator presses both the first and second control switches 80,85 simultaneously, then both the first and second masses 45,50 will move to the second position adjacent the windings 40. The change in inductance in the windings 40 will be greater than the inductance change caused by either the first mass 45 or the second mass 50 individually. In this manner, the sensing circuitry is able to sense that both the first and second control switches 80,85 were pressed and produce a corresponding control signal.

Various kinds of inductance sensing circuits are known in the art. One particularly suitable sensing circuit 95 for use in an embodiment of the present invention is shown in FIG. 2. As shown in FIG. 2, the circuit includes a frequency generator 100 that produces a signal at a predetermined frequency. The output of the frequency generator is connected to a capacitor 105 which in turn is connected to the electrical conductor windings 40. A resistor 110 is connected between the windings 40 and ground. The signal developed across the resistor 110 is then rectified by the diode 115. The rectified signal is connected to a capacitor 120 which is connected to ground. The signal appearing across the capacitor 120 is a DC voltage that is directly proportional to the frequency of the rectified signal. The DC voltage is then input to several comparators 125, 130, 135, 140 that produce output signals as a function of the input DC voltage.

As shown in FIG. 2, the first and second masses 45,50 are shown in the first position. The first mass 45 is also shown in phantom in the second position adjacent to the windings 40. As is known to those skilled in the art, the inductance of the windings changes as the mass moves to the second position. This in turn changes the frequency of the signal across resistor 110 which will result in a corresponding output signal from one of the comparators 125, 130, 135, 140.

The present invention therefore provides a passive control switch that does not have wires physically attached to the moving switch. The control switch of the present invention is therefore more reliable and is less susceptible to shock or vibration damage.

We claim:

1. A joystick control switch, comprising:

a base;

a hollow shaft attached to a swivel mounting, and pivotally mounted to said base;

a handle attached to an end of the shaft and having a control switch mechanically attached to a mass installed within said shaft;

electrical conductor windings installed in said base adjacent said pivotal mounting;

sensing circuitry electrically connected to said electrical conductor windings; and a bell crank rotatably mounted within said handle, said control switch and said mass being pivotally connected to said bell crank;

wherein said control switch and said mass are normally biased to a first position, said mass is moved to a second position adjacent to said electrical conductor winding in response to said control switch being moved to a second position, and said sensing circuitry responsively produces a control signal.

2. The joystick control switch according to claim 1, including:

a switch linkage, wherein a first end of said switch linkage is pivotally mounted to said control switch and a second end of said switch linkage is pivotally mounted to said bell crank;

a mass linkage, wherein a first end of said mass linkage is pivotally attached to said bell crank and a second end of said mass linkage is attached to said mass; and biasing means for biasing said control switch and said mass to said first position.

3. The joystick control switch according to claim 2, wherein said biasing means includes a spring attached to said bell crank.

4. The joystick control switch according to claim 3, wherein said sensing circuitry includes:

inductance sensing means for producing an inductance signal;

frequency generator means for generating a signal of fixed frequency, said frequency generator means being electrically connected to said inductance sensing means;

rectifier means connected to said inductance sensing means for rectifying the inductance signal; and output means connected to said rectifying means for outputting the control signal.

5. A joystick control switch, comprising:

a base;

a hollow shaft pivotally mounted to said base;

a handle attached to an end of the shaft and having first and second control switches mechanically attached to first and second control masses installed within said shaft;

electrical conductor windings installed in said base adjacent said pivotal mounting;

sensing circuitry electrically connected to said electrical conductor windings;

wherein said first control switch and said first mass is movable between first and second positions, said first control switch and said first mass are normally biased to a first position, and said first mass is moved to a second position adjacent to said electrical conductor winding in response to said first control switch being moved to a second position and said sensing circuitry responsively produces a first control signal;

wherein said second control switch and said second mass is movable between first and second positions, said second control switch and said second mass are normally biased to a first position, and said second mass is moved to a second position adjacent to said electrical conductor winding in response to said first control switch being moved to a second position and said sensing circuitry responsively produces a second control signal;

wherein said sensing circuitry produces a third control signal in response to said first and second mass being in said first positions; and wherein said sensing circuitry produces a fourth signal is response to said first and second masses being in said second positions.

6. The joystick control switch according to claim 5, wherein:

the first mass includes a void; and the second mass can be moved in and out of said void.

7. The joystick control switch according to claim 6 wherein;

the second mass is in the form of a cylinder; and the first mass is in the form of a cylinder having a cylindrical void to accommodate the second mass.

8. The joystick control switch according to claim 6, wherein said sensing circuitry includes:

inductance sensing means for producing an inductance signal;

frequency generator means for generating a signal of fixed frequency, said frequency generator means being electrically connected to said inductance sensing means;

rectifier means connected to said inductance sensing means for rectifying the inductance signal; and output means connected to said rectifying means for outputting the first, second, third and fourth control signals.

* * * * *